United States Patent
Huang et al.

(10) Patent No.: US 7,064,452 B2
(45) Date of Patent: Jun. 20, 2006

(54) PACKAGE STRUCTURE WITH A RETARDING STRUCTURE AND METHOD OF MAKING SAME

(75) Inventors: Chen-Tung Huang, Taipei (TW);
Jim-Tren Tu, Puzih (TW);
Hsang-Hsing You, Dasi (TW);
Huang-An Lu, Taoyuan (TW);
Ming-Lan Chang, Jhongli (TW);
Tai-Ying Lee, Eriun (TW)

(73) Assignee: Tai-Saw Technology Co., Ltd., Taoyuan (TW)

( * ) Notice: Subject to any disclaimer, the term of this patent is extended or adjusted under 35 U.S.C. 154(b) by 0 days.

(21) Appl. No.: 10/701,900

(22) Filed: Nov. 4, 2003

(65) Prior Publication Data
US 2005/0093178 A1 May 5, 2005

(51) Int. Cl.
*H01L 21/44* (2006.01)
*H01L 21/48* (2006.01)
*H01L 21/50* (2006.01)

(52) U.S. Cl. ............... 257/787; 257/778; 257/E23.131

(58) Field of Classification Search ............. None
See application file for complete search history.

(56) References Cited

U.S. PATENT DOCUMENTS

| | | | |
|---|---|---|---|
| 6,011,301 A * | 1/2000 | Chiu | 257/678 |
| 6,214,643 B1 * | 4/2001 | Chiu | 438/108 |
| 6,420,204 B1 * | 7/2002 | Glenn | 438/64 |
| 6,509,635 B1 * | 1/2003 | Poddar | 257/678 |
| 6,566,745 B1 * | 5/2003 | Beyne et al. | 257/680 |
| 6,667,439 B1 * | 12/2003 | Salatino et al. | 174/52.1 |
| 6,744,109 B1 * | 6/2004 | Barton et al. | 257/436 |
| 2001/0014486 A1 * | 8/2001 | Glenn | 438/64 |
| 2004/0262781 A1 * | 12/2004 | Germain et al. | 257/787 |
| 2005/0051885 A1 * | 3/2005 | Weng et al. | 257/687 |

\* cited by examiner

*Primary Examiner*—David A. Zarneke
(74) *Attorney, Agent, or Firm*—Perkins Coie, LLP

(57) ABSTRACT

An encapsulant easily flows into a space between a substrate and an electronic device and contacts with an active region of the electronic device to affect the characteristic of the electronic device in the conventional arts. The present invention provides a package structure with a retarding structure to efficiently avoid the problem. The package structure comprises an electronic device, a substrate, a retarding structure, and an encapsulant. The substrate has conductive contacts disposed on an upper surface. The electronic device has an active region and conductive pads disposed on a first surface. The electronic device is electrically coupled to the substrate by conductive bumps between the conductive contacts and the corresponding conductive pads. The encapsulant is formed around a periphery of the electronic device. The retarding structure is disposed outside the active region on the first surface of the electronic device for avoiding the encapsulant contacting the active region of the electronic device.

8 Claims, 4 Drawing Sheets

PACKAGE STRUCTURE WITH A RETARDING STRUCTURE AND METHOD OF MAKING SAME

TECHNICAL FIELD

This invention relates to a Flip-Chip package structure, and more particularly to a package structure with a retarding structure.

BACKGROUND

The Flip-Chip technology is an advanced package technology for connecting chip and substrate. During packaging process, the chip is "flipped" and so the pads of the chip connect with the pads of the substrate. The materials of substrate suitable for Flip-Chip generally include ceramic substrate, silicon wafer, polymer, glass and so on. The flip-Chip technology thereof is widely applied in RF components, sensors, microprocessor, CCD, semiconductor lasers, LED, SAW (surface acoustic wave) device, Multichip Modules (MCM), etc., which is used for computer, PCMCIA card, martial equipment, personal communications, clocks, watches, LCD, and so on.

Flip-Chip technology has two main advantages. First, the signal transmitting distance between a chip and a substrate can be reduced and so it is suitable for packaging a high-speed device; second, the size of the packaged chip can be reduced as the size of chip before packaging, so it is suitable for the IC device requiring a smaller packaging size.

In those conventional arts, the Flip-Chip package structure of electronic devices is accomplished by forming bumps on pads of the surface of electronic devices (or on the substrate side), and connecting those bumps to pads on the substrate side (or the surface of electronic devices). After the Flip-Chip packaging, the gap between each electronic device and the substrate is sealed with resin to ease stress, to prevent the invasion of foreign matter, and to protect the bumps. However, if any foreign matter sticks to the surface of a GaAs element or a surface acoustic wave element, which is operable at a high frequency, the desired electric characteristics cannot be obtained, and therefore the gap between the substrate and the element should have an airtight structure, with the element covered by a resin all around.

To meet this requirement, a structure, in which the gaps between the substrate and the electronic devices are made airtight, is formed by dropping a resin of high viscosity type, which would not enter into the gaps between the substrate and the electronic devices, on the electronic devices and hardening it.

However, in a structure wherein Flip-Chip package electronic devices are covered with resin, signals often cannot be transmitted and fail to achieve the desired characteristics, since the resin enters through the gaps between the substrate and the electronic devices to come into contact with an active region of the electronic devices.

To avoid the aforementioned problem, in the U.S. Pat. No. 5,969,461, it discloses a structure of Underfill package technology. Referring to FIG. 1A, the resin 140 will flow into the space between the acoustic wave device 110 and the substrate 120 during the time from injecting the resin 140 to the resin 140 having been cured. Therefore, the dam 130 is disposed on the substrate 120 within the periphery 122 of the acoustic wave device 110 and interconnections formed by stud bumps 123 and conductive materials 124 for avoiding the resin 140 contacting with the active region of the acoustic wave device 110 and affecting the characteristic of the acoustic wave device. However, because the dam 130 is disposed within the stud bumps 123 and the conductive materials 124, the specific position relationships among the dam 130, the stud bumps 123, and the conductive materials 124 must be accurate, which increase a complexity of the process. Furthermore, the dam 130 is close to an active region of the acoustic wave device 110 and when the dam 130 does not abut a face 114 of the acoustic wave device 110, the resin 140 easily contacts with the active region as long as the resin 140 lightly flows over the dam 130.

Referring to FIG. 1B, the U.S. Pat. No. 6,262,513 discloses another encapsulation resin package technology. A resin layer 240 covers on an electronic device 210 and the substrate 220. A fluiding of the resin layer 240 must be low or no flow for avoiding flowing the resin layer 240 into the space between the electronic device 210 and the substrate 220 and affecting the characteristic of the electronic device as the Underfill package technology. Nevertheless, the resin layer 240 has the problem of thermal expansion when heating to cure the resin. A SiO2 is added into the resin layer 240 in order to reduce a thermal stress due to the difference of thermal expansion coefficient, but it results in decreasing the adhesion between the resin layer 240 and wires 290 and the hermeticity of the structure is so unsatisfactory.

In the U.S. Pat. No. 6,448,635, is also discloses a structure of Underfill package technology. As shown in FIG. 1C, a distance D1 between active region 340 and the adjacent peripheral surface 338A or 338C is more than 550 µm, and a distance D2 between each peripheral side surface 338B or 338D and the active region 340 is more than 200 µm. Referring to FIG. 1D, these distances prepare against the flowing of an encapsulant 306. Therefore, the encapsulant 306 extends under SAW device 332A, but the encapsulant 306 does not extend inward from each of surfaces 338A and 338C more than 550 µm. Therefore, the area of not active region is very large and, the packaged size will increase.

SUMMARY

In those conventional arts, the Flip-Chip technology has a problem that the encapsulant flows into a space between a substrate and an electronic device and contacts with an active region of the electronic device to affect the characteristic of the electronic device. One of objectives of the present invention is to provide a package structure for avoiding the encapsulant contacting with the active region.

Another objective of present invention is to provide a simple and low-cost package structure.

As aforementioned, the present invention provides a package structure with a retarding structure. The package structure comprises an electronic device, a substrate, a retarding structure, and an encapsulant. The substrate has conductive contacts disposed on an upper surface. The electronic device has an active region and conductive pads disposed on a first surface. The electronic device is electrically coupled to the substrate by conductive bumps between the conductive contacts and the corresponding conductive pads. The encapsulant is formed around a periphery of the electronic device. The retarding structure is disposed outside the active region on the first surface of the electronic device for avoiding the encapsulant contacting the active region of the electronic device.

The present invention also provides another package structure with a retarding structure. The package structure comprises an electronic device, a substrate, a trench, and an encapsulant. The substrate has conductive contacts disposed on an upper surface. The electronic device has an active region and conductive pads disposed on a first surface. The electronic device is electrically connected to the substrate by conductive bumps between the conductive contacts and the corresponding conductive pads. The trench is formed around a periphery of the electronic device and outside the active region on the first surface of the electronic device for avoiding the encapsulant contacting the active region of the electronic device.

The present invention also provides a method for packing an electronic device. The method comprising the steps of: providing a substrate having conductive contacts disposed on an upper surface thereof; providing an electronic device having an active region and conductive pads disposed on a first surface thereof; forming a retarding structure outside the active region on a first surface of the electronic device; connecting the electronic device onto the substrate by means of conductive bumps between the conductive contacts and corresponding the conductive pads; flowing an encapsulant at a periphery of the electronic device; and curing the encapsulant to harden the encapsulant for avoiding the encapsulant contacting with the active region of the electronic device.

DETAILED DESCRIPTION

Some sample embodiments of the invention will now be described in greater detail. Nevertheless, it should be recognized that present invention can be practiced in a wide range of other embodiments besides those explicitly described, and the scope of the present invention is expressly not limited expect as specified in the accompanying claims.

Then, the components of the different elements are not shown to scale. Some dimensions of the related components are exaggerated and meaningless portions are not drawn to provide a more clear description and comprehension of the present invention.

Figure 1A:
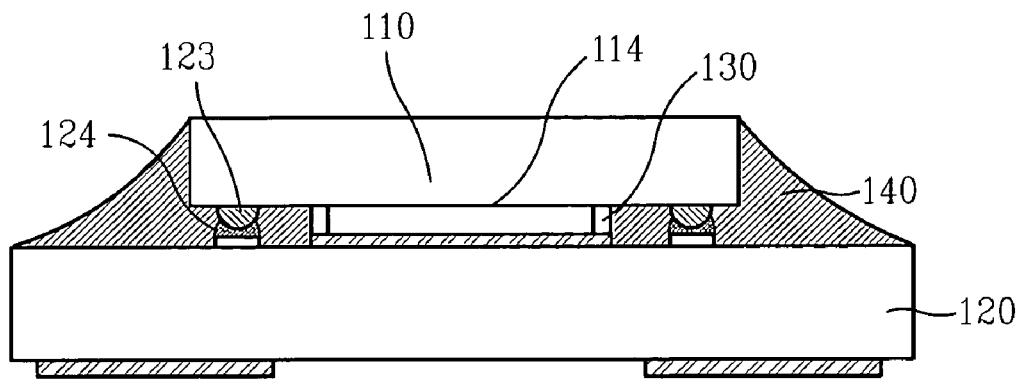
FIG. 1A is a schematic diagram of a structure of underfill package technology in the conventional arts.
Figure 1B:
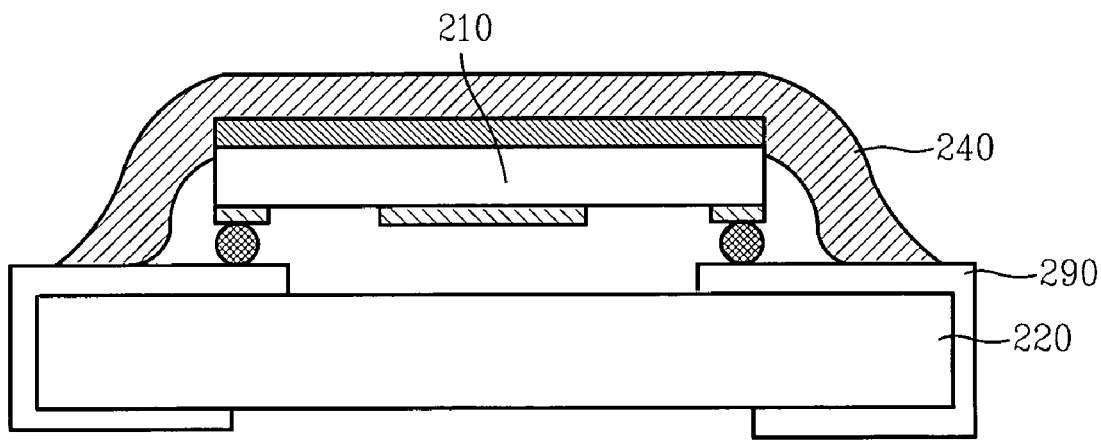
FIG. 1B is a schematic diagram of a structure of encapsulation resin package technology in the conventional arts.
Figure 1C:
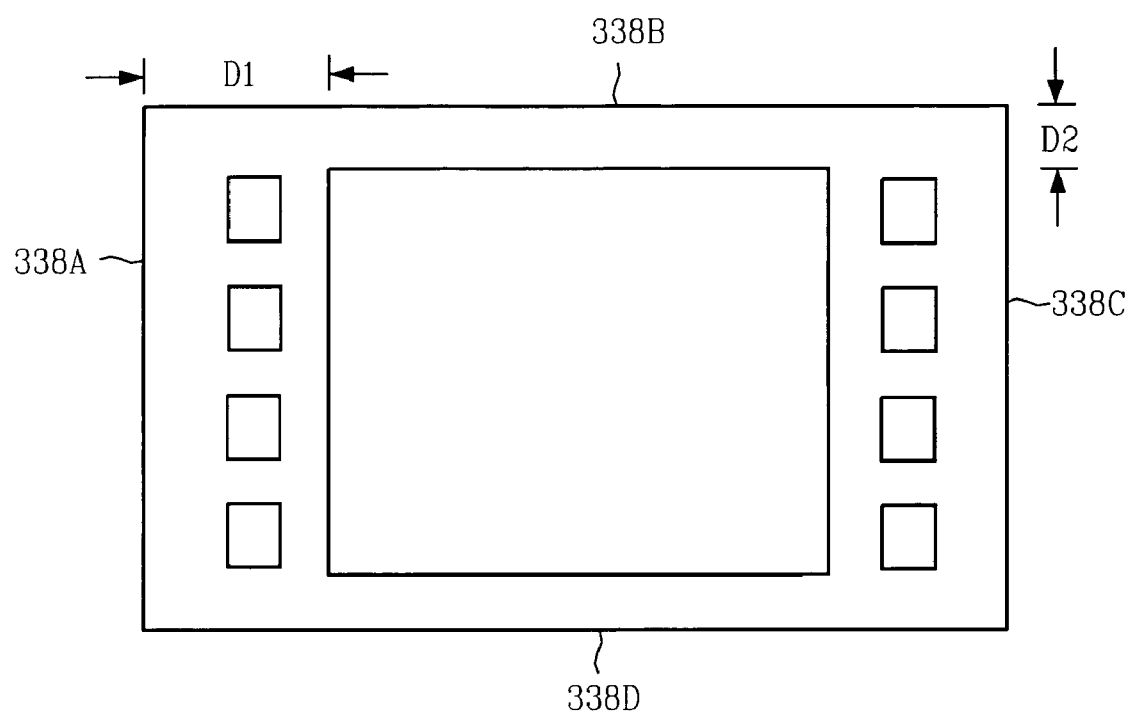
FIG. 1C and FIG. 1D are schematic diagrams of another structure of underfill package technology in the conventional arts.
Figure 1D:
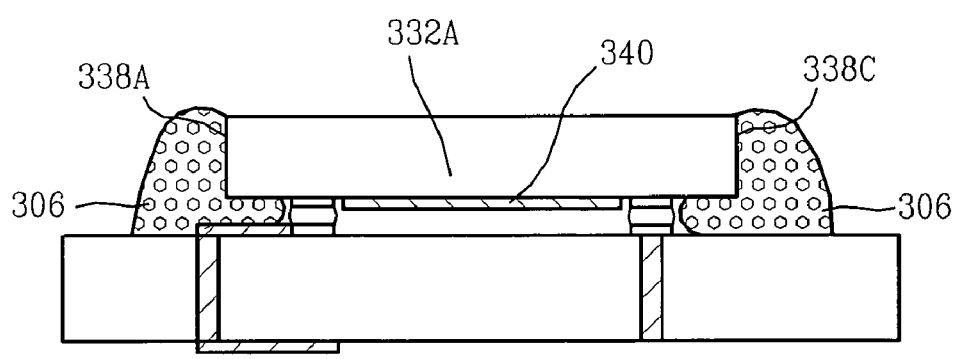
Figure 2A:
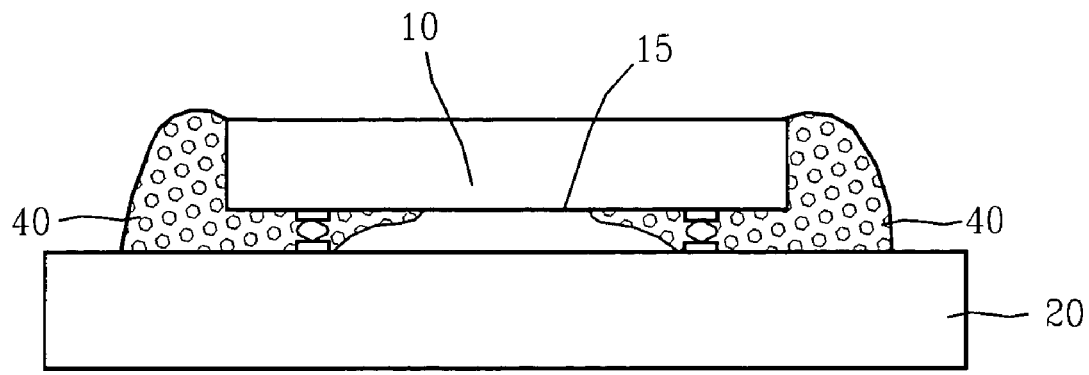
FIG. 2A is a schematic diagram of an encapsulant flowing into a space between an electronic device and a substrate due to capillary phenomenon according to this invention.

Due to capillary phenomenon, an encapsulant flows into a space between an electronic device and a substrate during duration from the encapsulant flowing around the electronic device to the encapsulant being cured and a characteristic of the electronic device is changed. According to our observation, the encapsulant 40 mainly flows into the space along a surface 15 of the electronic device 10, as shown in FIG. 2A. Therefore, the essence of the present invention is to increase a retarding structure for resisting the capillarity between the electronic device and the encapsulant.

Figure 2B:
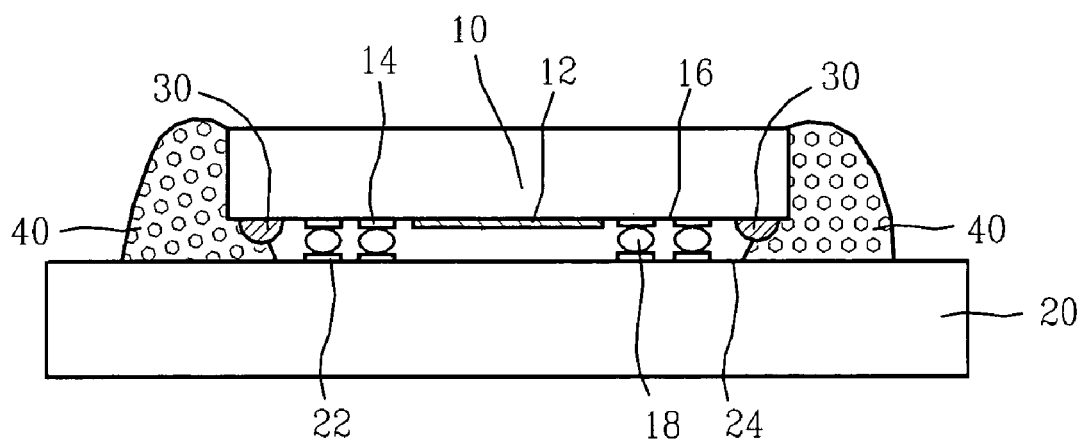
FIG. 2B shows a schematic diagram of one preferred embodiment in the present invention.

FIG. 2B shows a package structure of one preferred embodiment in the present invention. The package structure comprises an electronic device 10, a substrate 20, a retarding structure 30, and an encapsulant 40. The substrate 20 has conductive contacts 22 disposed on an upper surface 24. The electronic device has an active region 12 and conductive pads 14 disposed on a first surface 16. The electronic device 10 is electrically coupled to the substrate 20 by conductive bumps 18 between the conductive contacts 22 and the corresponding conductive pads 14. The encapsulant 40 is formed around a periphery of the electronic device 10. The retarding structure 30 is disposed outside the active region 12 on the first surface 16 of the electronic device 10 for avoiding the encapsulant 40 contacting the active region 12 of the electronic device 10.

The retarding structure 30 can be a protruding structure in the embodiment and a height thereof is preferably in the range of 20–40 percent of a distance between the substrate 20 and the electronic device 10, e.g. the distance between the substrate 20 and the electronic device 10 is 30 µm and the height of the retarding structure 30 is approximately 10 µm. The retarding structure 30 can be any material, such as a metal or a resin that includes epoxy, silicone, polyimide, and benzocyclobutene, even be that as same as the encapsulant 40. If the retarding structure 30 is made of a resin, it is preferably to perform a curing process to harden the retarding structure 30 before flowing the encapsulant 40 at a periphery of the electronic device 10.

In order to add the buffer distance between the active region and the retarding structure, the retarding structure is disposed outside of the conductive pads. Therefore, it is surer that the encapsulant is harder to extend to contact with the active region.

The formation method of the retarding structure may be a screen printing method or a photolithography method. Especially, the screen printing is a low-cost method with controllable yield.

In general, the encapsulant has a low fluidity at a low temperature, but the fluidity will gradually increase when the temperature gradually raises. Hence, the encapsulant mainly flows into the space between the electronic device and the substrate during a curing process for the encapsulant.

In order to reduce the wetting issue from capillary phenomenon, except for the aforementioned high viscosity, the material of the encapsulant more preferably has the following characteristics: (1) low or no flow fluiding; (2) solvent-free; and (3) thixotropic fluid. The property of thixotropy enables fluid to stiffen in a relatively short time on standing, but upon shear force to change to a very soft consistency or to a fluid of high velocity. The addition of suitable fillers to encapsulant can have the above flow characteristics. Exemplary fillers include an unconductive aluminum compound, e.g.: alumina, aluminum nitride, kaolin ($Al_2Si_2O_5(OH)_4$), and so on. Owing to thixotropy, the encapsulant can be easily dispensed by using conventional needle dispenser, such as Musashi dispenser.

Figure 3A:
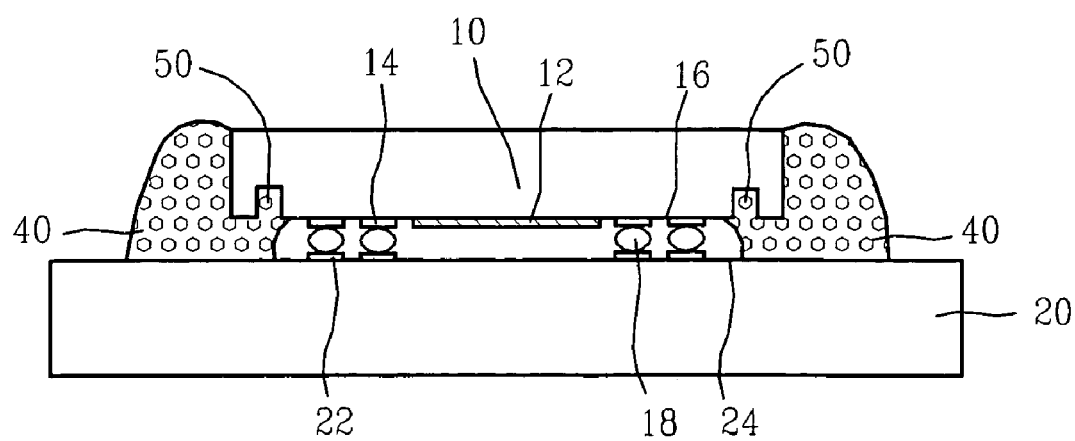
FIG. 3A shows a schematic diagram of another preferred embodiment in the present invention.

Moreover, the retarding structure may be a trench. FIG. 3A shows a package structure of another preferred embodiment in the present invention. The package structure comprises an electronic device 10, a substrate 20, a trench 50, and an encapsulant 40. The substrate 20 has conductive contacts 22 disposed on an upper surface 24. The electronic device has an active region 12 and conductive pads 14 disposed on a first surface 16. The electronic device 10 is electrically connected to the substrate 20 by conductive bumps 18 between the conductive contacts 22 and the corresponding conductive pads 14. The trench 30 is formed around a periphery of the electronic device 10 and outside the active region 12 on the first surface 16 of the electronic device 10.

In the conventional arts, it needs to add the distances between the active region and peripheral side surfaces to prepare against the flowing of the encapsulant. In the present invention, the trench can add the flowing path of the encapsulant for encapsulant spreading and keep the distance between the active region and peripheral side surfaces. Furthermore, the trench also increases the roughness of a first surface 16. The encapsulant 40 can be avoided contacting the active region 12 of the electronic device 10 without adding the die size in the present invention.

A depth of the trench 50 is preferably more than 150 µm, and the width of the trench 50 is more than 150 µm. The trench 50 with the aforementioned depth and width can efficiently avoid the encapsulant 40 flowing into the space between the substrate 20 and the electronic device 10 and contacting with the active region 12.

Figure 3B:
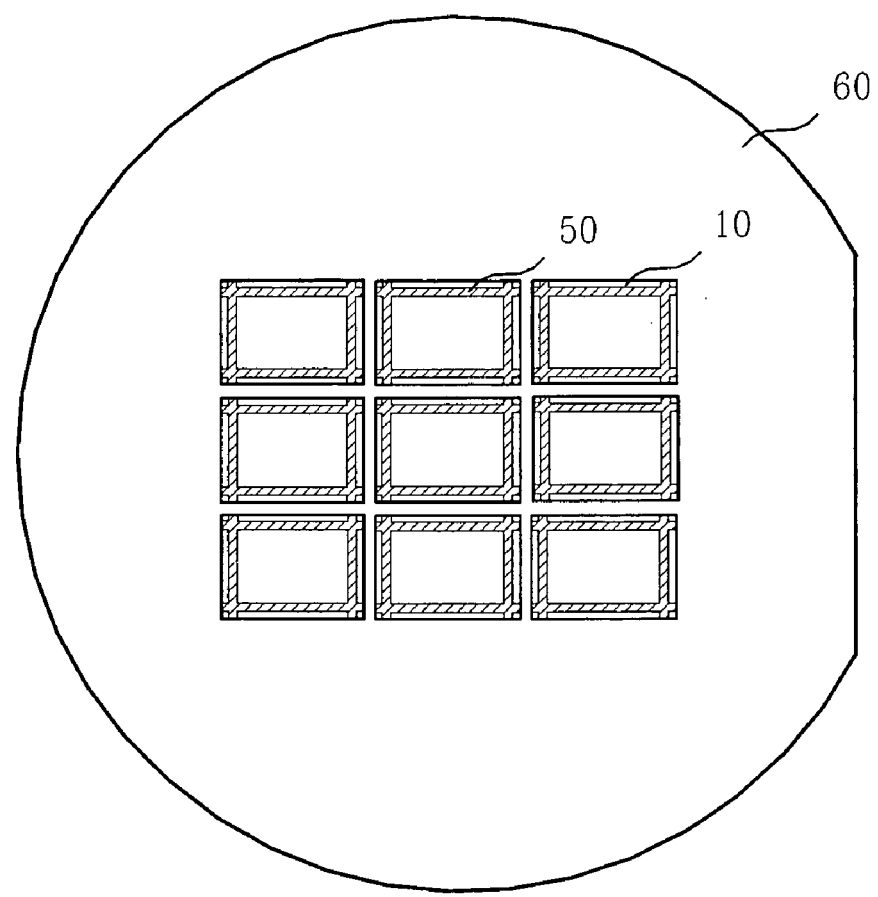
FIG. 3B is a schematic diagram of a trench formed before a cutting process in accordance with this invention.

In order to add the buffer distance between the active region and the trench, the trench is formed outside of the conductive pads. Therefore, it is surer that the encapsulant is hard to extend to contact with the active region. The trench 50 is preferably formed before a cutting process for dividing into each of the electronic devices 10 on a wafer 60, as shown in FIG. 3B.

The forming method of the trench 50 may be a half cutting, a sand-blasting or etching process. Before the sand-blasting or etching performs, a protecting layer, e.g. preform film or photolithography defined mask, is covered on the electronic device 10 expect for the area corresponding the trench 50. Next, the sand-blasting or etching process forms trench 50 and then the protecting layer is removed.

The retarding structure also can be formed on the substrate to reducing the wetting issue. The retarding structure on the substrate also can increase the roughness and the effective distance for encapsulant spreading.

As aforementioned, in order to reduce the wetting issue from capillary phenomenon, the material of the encapsulant has the following characteristics: (1) high viscosity; (2) low or no flow fluiding; (3) solvent-free; and (4) thixotropic fluid. The addition of suitable fillers to epoxy can have the above flow characteristics. Exemplary fillers include an unconductive aluminum compound, e.g.: alumina, aluminum nitride, kaolin ($Al_2Si_2O_5(OH)_4$), and so on.

According to the above-mentioned, the present invention also discloses a method for packing electronic device. The method is preformed as below. First, a substrate is provided and conductive contacts are disposed on an upper surface of the substrate. Next, an electronic device is provided, that has an active region and conductive pads disposed on a first surface thereof. Then, a retarding structure is formed outside the active region. Subsequently, the electronic device is flipped onto the substrate and the first surface of the electronic device faces the upper surface of the substrate, and the conductive contacts and the corresponding conductive pads are connected by means of conductive bumps. An encapsulant is flowed at a periphery of the electronic device, and finally the encapsulant is cured for avoiding the encapsulant contacting with the active region of the electronic device.

The retarding structure may be a protruding structure or a trench. When the retarding structure is a protruding structure and made of a resin, the method further comprises a step of curing the retarding structure.

Types of the electronic device 10 applied with the present invention will not be limited. For example, the package assembly and the method of the present invention can apply to RF components, sensors, EPROM, CCD, semiconductor lasers, LED, SAW (surface acoustic wave) device and so on.

Hence, compared with the conventional arts having the aforementioned drawbacks, the present invention employs a retarding structure between the electronic device and the substrate to overcome the conventional drawbacks. The retarding structure not only efficiently avoids the encapsulant contacting with the active region, but also is a simple and low-cost package structure.

Although specific embodiments have been illustrated and described, it will be obvious to those skilled in the art that various modifications may be made without departing from what is intended to be limited solely by the appended claims.

We claim:

1. A package structure with a retarding structure, comprising:
    a substrate having conductive contacts disposed on an upper surface thereof;
    an electronic device having an active region and conductive pads disposed on a first surface thereof, wherein said electronic device is electrically coupled to said substrate by conductive bumps between said conductive contacts and corresponding said conductive pads;
    an encapsulant formed around a periphery of said electronic device; and
    a trench formed around said active region on said first surface of said electronic device for avoiding said encapsulant contacting said active region of said electronic device.

2. The package structure in claim 1, wherein a width of said trench is wider than 150 µm.

3. The package structure in claim 1, wherein a depth of said trench is deeper than 150 µm.

4. The package structure in claim 1, wherein said trench is formed by photolithography.

5. The package structure in claim 1, wherein said trench is formed by sand-blasting.

6. The package structure in claim 1, wherein said trench is formed by etching process.

7. The package structure in claim 1, wherein said encapsulant is a thixotropic fluid.

8. The package structure in claim 1, wherein said encapsulant comprises an unconductive aluminum compound.

* * * * *